(12) United States Patent     (10) Patent No.: US 7,062,748 B2
Mellmann     (45) Date of Patent: Jun. 13, 2006

(54) SYSTEM AND METHOD OF CORRECTING MASK RULE VIOLATIONS AFTER OPTICAL PROXIMITY CORRECTION

(75) Inventor: Joerg Mellmann, Williston, VT (US)

(73) Assignee: Infineon Technologies AG, Munich (DE)

( * ) Notice: Subject to any disclaimer, the term of this patent is extended or adjusted under 35 U.S.C. 154(b) by 360 days.

(21) Appl. No.: 10/648,493

(22) Filed: Aug. 25, 2003

(65) Prior Publication Data

US 2005/0050511 A1    Mar. 3, 2005

(51) Int. Cl.
*G06F 17/50* (2006.01)
*G03C 5/00* (2006.01)
*G03F 1/00* (2006.01)

(52) U.S. Cl. ............... 716/19; 430/5; 430/30
(58) Field of Classification Search ............... 716/19, 716/8, 9; 430/5, 30
See application file for complete search history.

(56) References Cited

U.S. PATENT DOCUMENTS

| | | | |
|---|---|---|---|
| 5,705,301 A * | 1/1998 | Garza et al. ............... | 430/5 |
| 5,862,058 A | 1/1999 | Samuels et al. | |
| 6,078,737 A * | 6/2000 | Suzuki ............... | 716/19 |
| 6,482,559 B1 | 11/2002 | Lin | |
| 6,523,162 B1 * | 2/2003 | Agrawal et al. ............... | 716/19 |
| 6,574,784 B1 * | 6/2003 | Lippincott et al. ............... | 716/8 |
| 6,753,115 B1 * | 6/2004 | Zhang et al. ............... | 430/5 |
| 6,782,524 B1 * | 8/2004 | Rittman ............... | 716/19 |
| 6,816,997 B1 * | 11/2004 | Teh et al. ............... | 716/5 |
| 2002/0007481 A1 * | 1/2002 | Ono ............... | 716/21 |
| 2004/0123264 A1 * | 6/2004 | Tsai et al. ............... | 716/19 |
| 2004/0230938 A1 * | 11/2004 | Sharpe et al. ............... | 716/21 |
| 2005/0022151 A1 * | 1/2005 | Rittman et al. ............... | 716/19 |
| 2005/0044514 A1 * | 2/2005 | Wu et al. ............... | 716/5 |

* cited by examiner

*Primary Examiner*—A. M. Thompson
*Assistant Examiner*—Magid Y. Dimyan
(74) *Attorney, Agent, or Firm*—Slater & Matsil, L.L.P.

(57) ABSTRACT

A method is provided for correcting rule violating areas of a photomask using a digital representation of the photomask. The method includes identifying violating areas of the photomask from a digital representation of the photomask. The violating areas include areas that violate a minimum width rule and/or areas that violate a minimum space rule for the photomask. The violating areas are then manipulated for the purpose of eliminating the violating areas. They are manipulated differently based on whether the violating area lies inside a design shape of a layout pattern to be imaged using the photomask and/or whether the violating area lies outside the design shape.

21 Claims, 6 Drawing Sheets

SYSTEM AND METHOD OF CORRECTING MASK RULE VIOLATIONS AFTER OPTICAL PROXIMITY CORRECTION

BACKGROUND OF THE INVENTION

The present invention is related to photolithography. More specifically, the invention relates to a system and method for correcting rule violations of a digital representation of a photomask, especially after the digital representation has been corrected for optical proximity.

In the fabrication of integrated circuits, the process of converting a desired electrical circuit schematic into patterns to be imaged on an integrated circuit ("IC" or "chip") involves many steps. The electrical circuit schematic is first converted into a desired chip layout having a set of patterns to be produced on a semiconductor chip. Such chip layout typically includes conductor patterns, active semiconductor area patterns and isolation area patterns at a lowest and most densely patterned level of the chip. The chip layout also includes wiring patterns at higher levels of the chip. These patterns are typically produced on the chip by photolithographic imaging onto a photoresist layer through several photomasks (hereinafter, "masks"), each mask having a set of mask patterns for producing the patterns in the photoresist.

A photolithographic imaging system includes an illumination source, a mask, and lenses for focusing an image produced by the mask onto a photoresist layer on a substrate such as a semiconductor wafer.

The circuit layout is densest and the patterns are the smallest at the lowest (semiconductor) level of the wafer. The patterns are so small that the images produced by the photolithographic imaging system are near the limit of resolution of the imaging system. Diffraction can cause the light passing through the openings of the mask to interfere constructively and destructively.

Because of this, the smallest patterns on a wafer generally cannot be printed directly by images of the same patterns on a mask. The imaging system simply cannot produce exactly the same image on the wafer that appears on the mask. A phenomenon known as "photolithographic line end shortening" can occur, by which the ends of line patterns appear shorter as imaged in the photoresist than they do on the mask. The image can also vary based on whether patterns are spaced at even spacings from each other or at irregular spacings.

Thus, the degree of change in the image from the mask patterns to the photoresist patterns is a function of the proximity of patterns on the mask in view of the size of the feature to be printed and the resolution limit of the imaging system.

Optical proximity correction (OPC) is a method used to correct for the above effect to generate the patterns of a mask. The goal of OPC is to generate a set of mask patterns that will result in the desired image on a wafer. Typically, a data set representing a layout pattern is provided to a computer system executing an OPC program. The OPC program predicts changes that would occur in the photoresist image if the mask contained the same layout pattern. The layout pattern of the mask is then altered by the OPC program in a way that is predicted to produce the correct image on the wafer. All of these steps are performed according to a program executed on a computer with respect to a data set representing the layout pattern.

For example, as shown in FIG. 1, a layout pattern includes a plurality of design shapes including the shapes 10, 12, 14 and 16 and 18. Because of optical proximity, the design shapes may not be capable of being printed by a set of patterns of a mask having the same shapes. Accordingly, the layout pattern is processed according to an OPC program to generate a set of mask shapes that will result in a desired layout pattern on the semiconductor wafer. FIG. 2 illustrates the corresponding mask shapes 200, 202, 204, 206 and 208 that result after OPC processing. The contours of the original design shapes 10, 12, 14, 16 and 18 are indicated in FIG. 2 by dotted line.

However, the result after OPC processing may still not be usable. This is because OPC processing is only concerned with the layout pattern to be produced on the wafer, but not the patterns of the mask. Each mask type has a set of rules which define the limits of how patterns can be formed thereon. Pattern elements must conform to the mask rules. If the pattern elements do not conform to the rules, the mask cannot be made. After OPC processing, the data set representation of the mask patterns may contain elements that cannot be fabricated on the mask. Such elements are referred to as "mask rule violations".

Therefore, a system and method is needed by which mask data representing OPC corrected mask shapes is corrected for mask rule violations.

It would be desirable to provide a system and method of generating mask pattern data following OPC that quickly arrives at final mask patterns.

It would further be desirable to provide a method for correcting mask rule violations in OPC corrected mask data that is expected to finish within a finite number of iterations.

It would further be desirable to provide a method for correcting mask rule violations in OPC corrected mask data that gradually reverses OPC corrections to remove the mask rule violations.

SUMMARY OF THE INVENTION

According to an aspect of the invention, a method is provided for correcting rule violating areas of a photomask using a digital representation of the photomask. The method includes identifying violating areas of the photomask from a digital representation of the photomask. The violating areas include areas that violate a minimum width rule and/or areas that violate a minimum space rule for the photomask. The violating areas are then manipulated for the purpose of eliminating the violating areas. They are manipulated differently based on whether the violating area lies inside a design shape of a layout pattern to be imaged using the photomask and/or whether the violating area lies outside the design shape.

According to another aspect of the invention, a machine readable storage medium is provided having a set of instructions recorded thereon for performing a method for correcting rule violating areas of a photomask using a digital representation of the photomask. The method includes identifying violating areas of the photomask from a digital representation of the photomask. The violating areas include areas that violate a minimum width rule and/or areas that violate a minimum space rule for the photomask. The violating areas are then manipulated for the purpose of eliminating the violating areas. They are manipulated differently based on whether the violating area lies inside a design shape of a layout pattern to be imaged using the photomask and/or whether the violating area lies outside the design shape.

According to a particular aspect of the invention, the method further includes manipulating the violating areas differently based on whether an area violates a minimum width rule and whether an area violates a minimum space rule for the photomask.

According to an aspect of the invention, a violating area is manipulated by enlarging an area that violates a minimum width rule when the area lies inside a design shape.

According to another aspect of the invention, a violating area is manipulated by enlarging an area that violates a minimum space rule when the area lies outside a design shape.

According to yet another aspect of the invention, a violating area is manipulated by removing an area that violates a minimum width rule when the area lies outside a design shape.

According to yet another aspect of the invention, a violating area is manipulated by filling an area that violates a minimum space rule when the area lies inside a design shape.

According to yet another aspect of the invention, violating areas are manipulated by enlarging an area that violates a minimum width rule when the area lies inside a design shape;
  removing a violating area which violates a minimum width rule when the violating area lies outside a design shape;
  filling a violating area which violates a minimum space rule when the violating area lies inside a design shape; and
  enlarging a violating area which violates a minimum space rule when the violating area lies outside a design shape.

According to still another aspect of the invention, the digital representation of the photomask is corrected for optical proximity prior to identifying the violating areas.

According to still another aspect of the invention, the violating areas include an area violating a minimum space rule between one filled area of a mask shape and another filled area of the mask shape.

According to yet another aspect of the invention, violating areas include an area violating a minimum space rule between one mask shape and another mask shape of the photomask.

According to another aspect of the invention, a system is operable to correct rule violations of a photomask using a digital representation of the photomask, the system being operable to identify violating areas of the photomask from a digital representation of the photomask, the violating areas including at least one of areas violating a minimum width rule and areas violating a minimum space rule for the photomask, the system further being operable to manipulate each of the violating areas differently based on the placement of the violating area relative to a design shape of a layout pattern to be imaged using the photomask, the manipulation being for the purpose of eliminating the rule violations.

DETAILED DESCRIPTION

The present invention provides a system and method of correcting mask rule violations in a digital representation of a photomask. The digital representation of the photomask is generated from a digital representation of a plurality of design shapes to be created on a semiconductor chip or wafer. Typically, optical proximity correction (OPC) is performed when generating the shapes of a mask from the design shapes. Through OPC, a set of mask shapes are created that are altered from the design shapes to better enable the design shapes to be printed on the wafer. However, after OPC the mask shapes may violate mask rules.

In an embodiment of the invention, a process is carried out to manipulate violating areas of the mask for the purpose of eliminating the violations of the violating areas. By carrying out the process, mask rule violations are gradually lessened, with the goal of eliminating mask rule violations. In such way, particular OPC corrections that violate mask rules are gradually reversed until the mask rule violations are satisfactorily removed from the mask. The process can be performed iteratively multiple times with the purpose of eliminating all mask rule violations.

Figure 3:
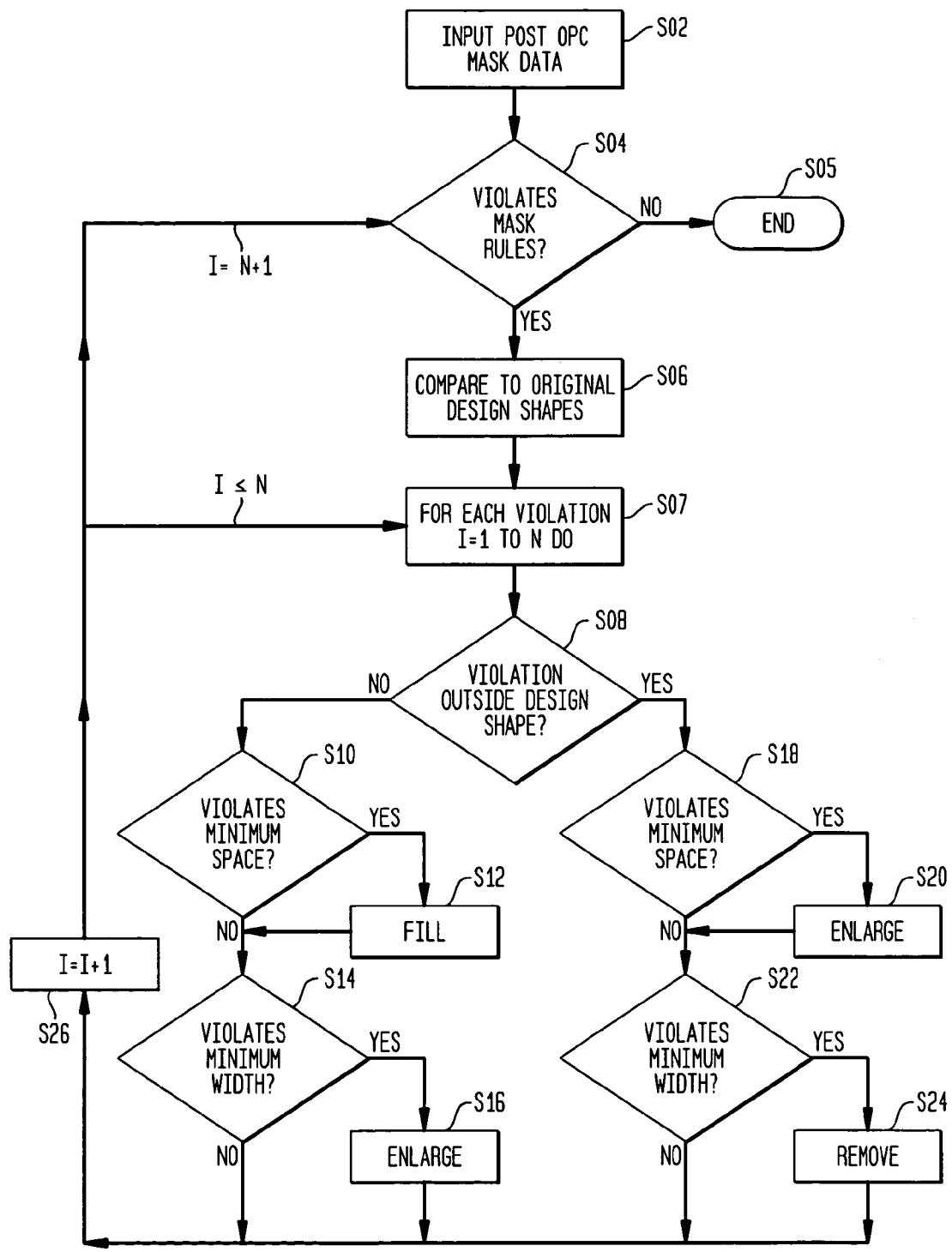
FIG. 3 is a flow diagram illustrating a method embodiment of the invention.

As illustrated in FIG. 3, a set of mask data following OPC are input to be processed (S02). The mask data specifies a set of mask shapes that are to be formed on the mask. Next, it is determined whether the mask shapes violate any mask rules. (S04). If the mask shapes do not violate any mask rules, then processing ends. (S05). However, if the mask shapes do violate any mask rules, then further processing is performed to manipulate the mask shapes for the purpose of eliminating mask rule violations.

Figure 4:
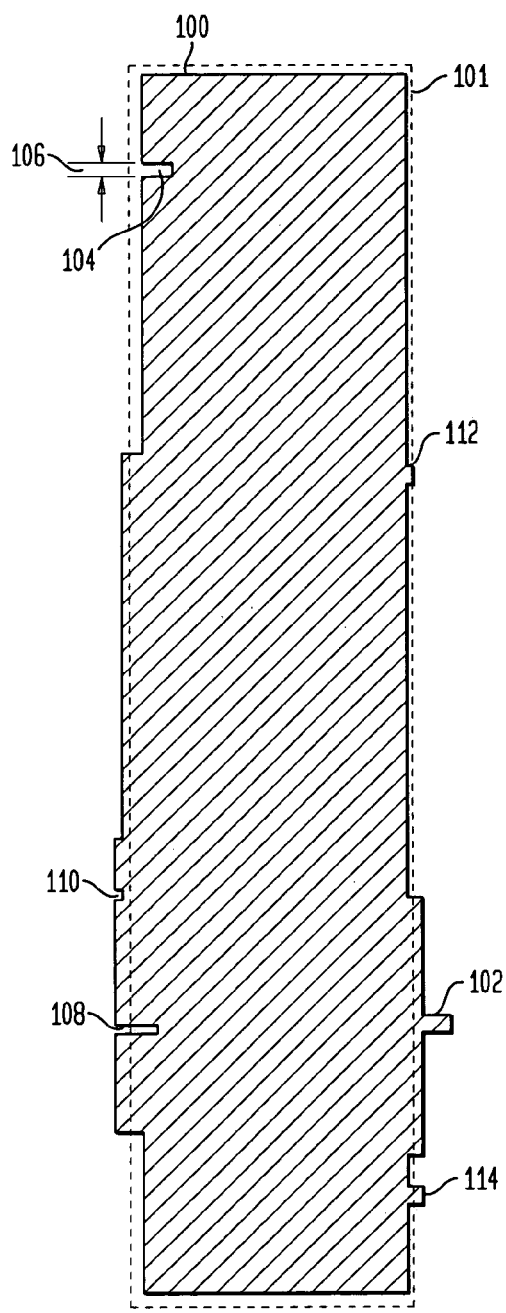
FIG. 4 is a plan view illustrating an OPC corrected mask shape prior to processing according to an embodiment of the invention.

Referring to FIG. 4, an original design shape 101 to be created on a chip is indicated by the rectangular dotted outline. Such design shape is illustrated merely by way of example, as the design shapes of a chip layout pattern can be of many different shapes. The mask shape after OPC is illustrated at 100.

Mask rule violations are of two types. Minimum space violations occur in areas of the mask shape 100 where there is insufficient minimum space between portions of the mask shape. Referring to FIG. 4, area 104 is an example of a minimum space violation because the space 106 between filled portions of the mask shape 100 is less than the required minimum space for making the mask.

Figure 1:
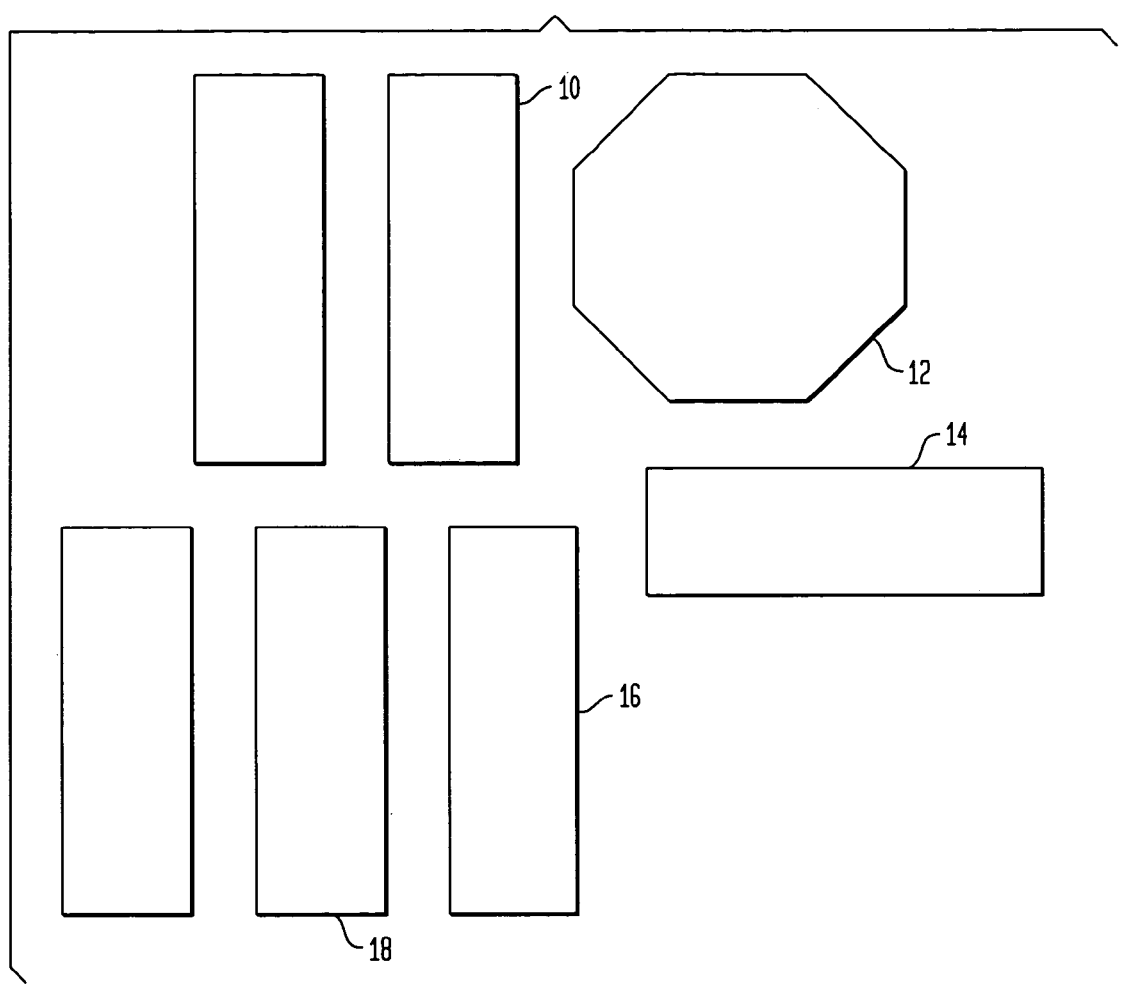
FIG. 1 is a plan view illustrating a set of design shapes of a chip layout pattern to be printed on a wafer.
Figure 2:
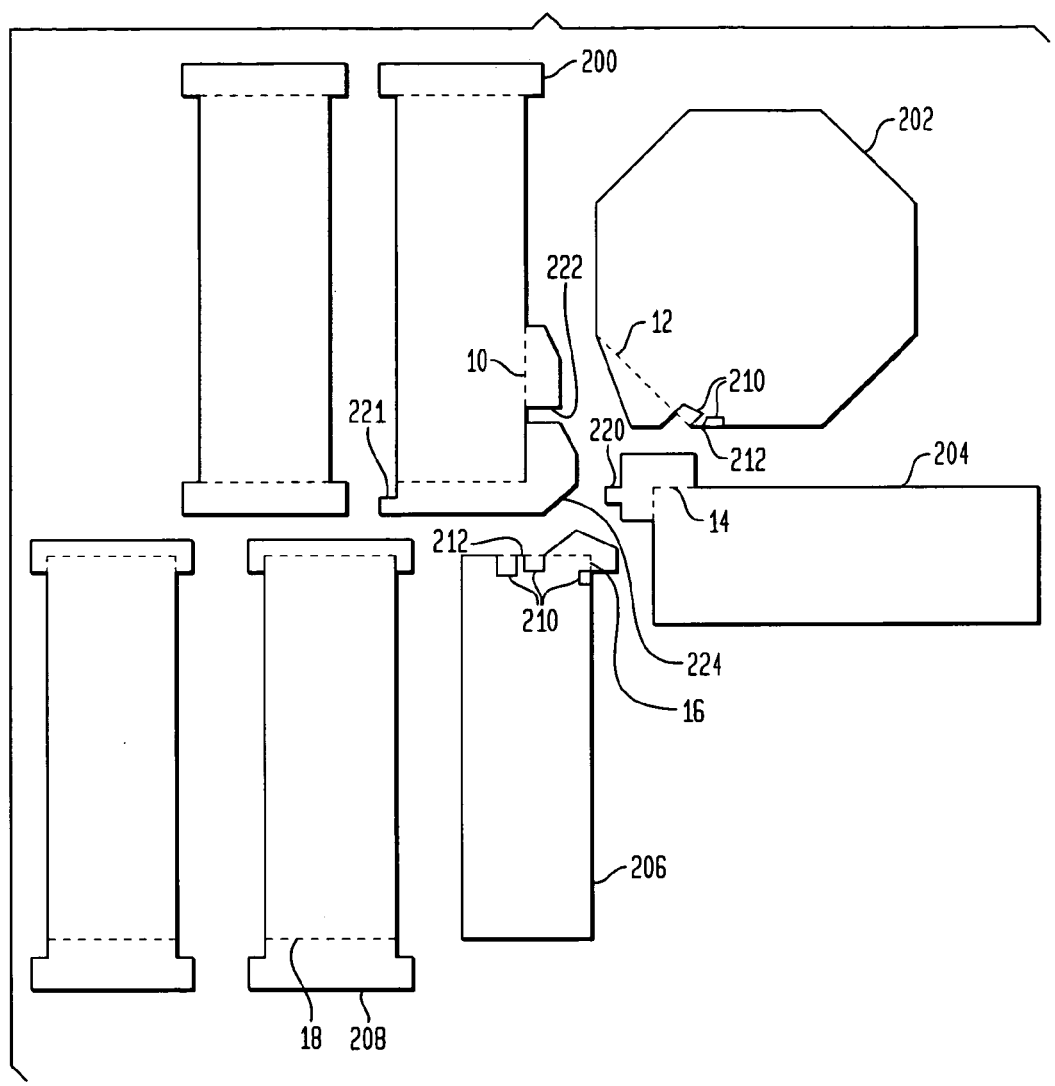
FIG. 2 is a plan view illustrating a set of OPC corrected mask shapes corresponding to the set of design shapes of FIG. 1.

A minimum space violation can also occur where there is insufficient space between one mask shape and another. As shown in FIG. 2, a minimum space violation can occur between a portion of a mask shape and another mask shape in proximity thereto. For example, a protruding portion 220 of a mask shape 204 may violate a minimum space rule in relation to a protruding portion 224 of another mask shape 200.

Referring again to FIG. 4, minimum width violations occur in areas where a portion of a mask shape is smaller than minimum width. Areas 102, 112 and 114 are examples of minimum width violations.

Referring again to FIG. 3, after it is determined that the OPC processed mask shapes violate a mask rule, processing is performed to compare the mask shapes to the original design shapes of the wafer layout. (S06). As shown in FIG. 4, a particular mask shape 100 can include an area 102 that lies outside the original design shape 101. Alternatively, or in addition thereto, the mask shape 100 can include an area 104 that lies inside the original design shape 101.

Beginning with step S07, processing then proceeds for every mask rule violation identified in step S04. In step S08, processing determines whether a particular mask rule violation lies outside a design shape. (S08) If the answer is NO, i.e., the mask rule violation does not lie outside the design shape, then processing proceeds to S10. Areas 104, 108, 112 and 114 of mask shape 108 include areas that lie inside the design shape 101 indicated by the dotted line.

The manipulation of the mask rule violation is varied depending on the type of violation. If the area violates a minimum space rule, then the area, being inside a design shape, is filled. (S10, S12). Filling a minimum space violation that lies inside a design shape is considered less likely to interfere with the OPC correction that was made in generating the mask shape 101. Since the minimum space violation is inside the design shape, filling it will generally not cause a minimum space violation between the mask shape 101 and another mask shape adjacent thereto (not shown).

As shown in FIG. 4, area 104 lies within the design shape 101 and violates a minimum space rule. Area 108 violates a minimum space rule and includes a portion which lies inside the design shape 101.

Figure 5:
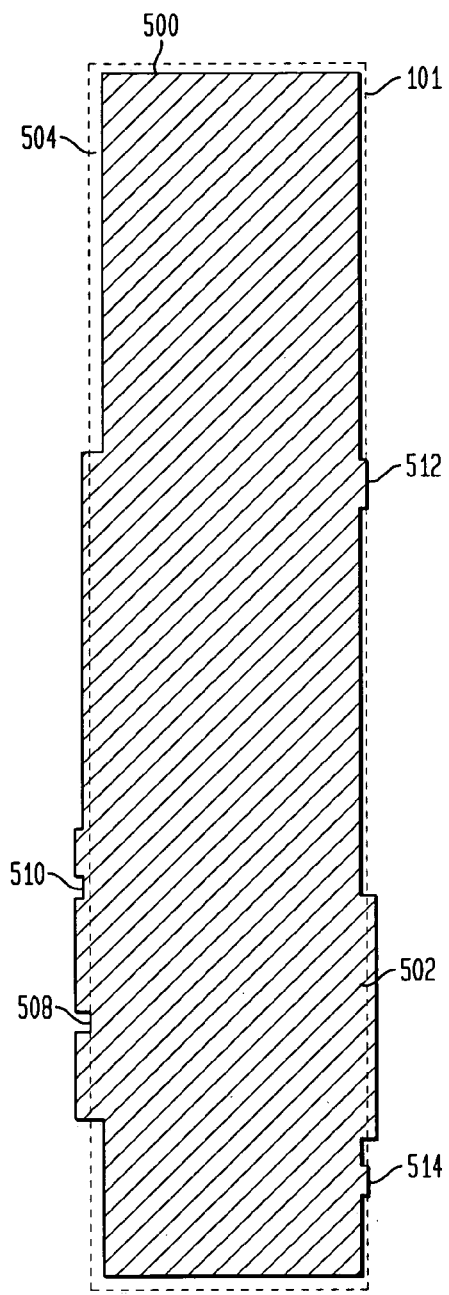
FIG. 5 is a plan view illustrating a mask shape corrected by processing according to an embodiment of the invention.

FIG. 5 illustrates the mask shape 500 after processing in accordance with the embodiment described herein. As shown in FIG. 5, 504 and 508 indicate former violating areas of the mask shape 500 that have been filled. With respect to the violating area 108, processing is performed in two parts: the processing of a portion lying within the design shape 101 and the processing of a portion lying outside of the design shape 101. As shown in FIG. 5, the portion of the minimum space violating area 108 lying inside the design shape 101 has been filled. As described more fully below, the portion of the minimum space violating area 108 lying outside the design shape 101 is enlarged to become a wider space 508.

Processing is also performed based on whether the area violates a minimum width rule. If it violates a minimum width rule, then the area, being inside a design shape, is enlarged. (S14, S16). Enlarging a minimum width violation that lies inside a design shape is considered unlikely to interfere with the OPC correction that was made in generating the mask shape 101. It is not likely to cause a minimum space violation from the mask shape 500 to another shape adjacent thereto on the mask (not shown) because the enlarged area lies inside a design shape 101.

As shown in FIG. 4, area 112 lies within the design shape 101 and violate a minimum width rule. Area 114 violates a minimum width rule and includes a portion which lies inside the design shape 101.

FIG. 5 illustrates the mask shape 500 after processing in accordance with the embodiment described herein. As shown in FIG. 5, 512 and 514 indicate former violating areas of the mask shape 500 that have been enlarged. With respect to the violating area 114, processing is performed in two parts: the processing of a portion lying within the design shape 101 and the processing of a portion lying outside of the design shape 101. As shown in FIG. 5, the portion of the minimum width violating area 114 that lies inside the design shape 101 has been enlarged. As described more fully below, the portion of the minimum width violating area 114 lying outside the design shape 101 is removed.

If the violating area does not violate a minimum width rule, then processing of the next violating area (S26) proceeds from step S07 again. At step S08, processing determines whether the next violating area lies outside a design shape. (S08) This time, if the answer is YES, i.e., the violating area does lie outside the design shape 101, then processing proceeds to S18. For example, areas 102, 108, 110 and 114 either lie completely outside the design shape 101 or include areas that lie outside the design shape 101.

Again, the manipulation of the violating area is varied depending on the type of violation. If the area violates a minimum space rule, then the area, being outside a design shape, is enlarged. (S18, S20). As shown in FIG. 4, area 110 lies outside the design shape 101 and violates a minimum space rule. As shown in FIG. 5, the open area 110 is enlarged as area 510 to the point that it does not violate the minimum space rule. In the case of minimum space violating area 108, the portion of the violating area that lies outside of the design shape 101 is enlarged, as shown at 508.

Enlarging a minimum space violation that lies outside a design shape is considered less likely to interfere with the OPC correction that was made in generating the mask shape. Enlarging the spacing of a minimum space violating area will not cause the spacing between the mask shape 500 and another mask shape (not shown) to violate a minimum space rule. However, it is possible that a minimum width violation might thereafter occur in the contour of the mask shape 500 itself.

In step S22, processing is performed based on whether the area violates a minimum width rule. If it violates a minimum width rule, then the area, being outside a design shape, is removed. (S22, S24). Removing the violating area will not cause a minimum space violation between the mask shape 101 and another shape of the mask adjacent thereto (not shown). 102 and 114 indicate areas that violate a minimum width rule. Area 114 includes a portion which lies outside the design shape 101. Only that portion is removed, whereas the portion inside the design shape 101 is enlarged, as described above. As shown in FIG. 5, 502 and 514 indicate areas of the mask shape 500 corresponding to areas 102 and 114 after processing.

If the particular area does not violate a minimum width rule, then the processing of the next violating area (S26) proceeds from step S07 again. This process then continues for each violating area identified prior thereto in step S04 until all such violating areas have been processed.

Then, when all violating areas have been processed, processing returns to step S04 again to determine whether any area of the corrected mask still violates a mask rule. For example, this could be true if the enlargement of a minimum width violating area caused another violation, such as a minimum space violation. Alternatively, the enlargement of a minimum space violating area could cause a minimum width violation to occur. It is also possible that the filling of a minimum width violating area could cause a minimum space violation to occur.

If the answer is YES, that there is a mask rule violation, then processing proceeds again from step S06 as described above. If the answer is NO, and there are no mask rule violations, then processing is completed (S05). As a result of the processing, a data set representing OPC corrected shapes of the mask has now been generated that does not violate the rules for fabricating the particular mask.

Figure 6:
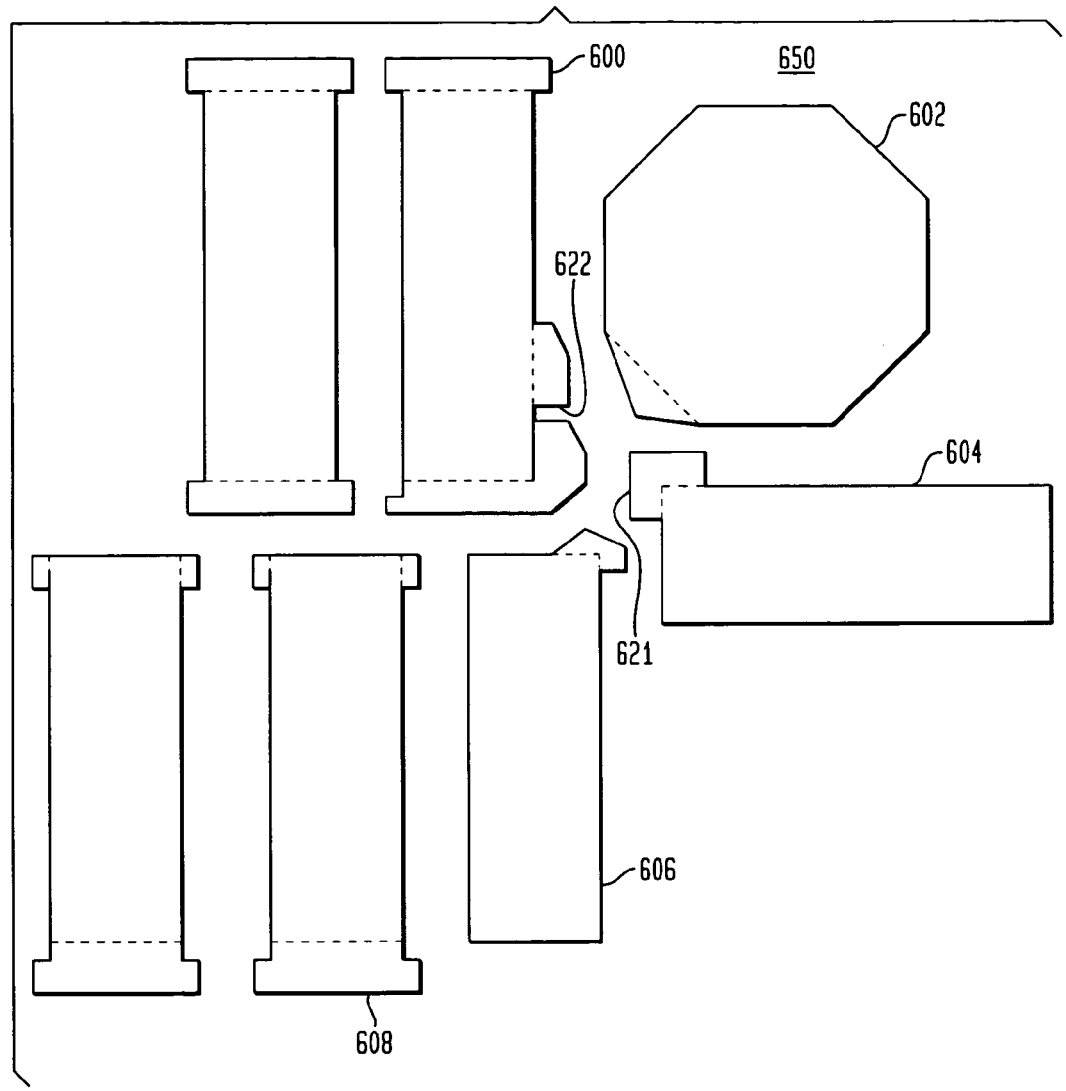
FIG. 6 is a plan view illustrating a set of mask shapes corrected by processing according to an embodiment of the invention, the corrected mask shapes corresponding to the set of OPC corrected mask shapes illustrated in FIG. 2.

FIG. 6 is a top (plan) view of a set of shapes 600, 602, 604, 606 and 608 of a corrected mask 650 corresponding to the shapes 200, 202, 204, 206 and 208 of the mask 250, illustrating the changes resulting from processing according to an embodiment of the invention. The differences are as follow: areas 210 inside design shapes that violate minimum space rules have been filled. In addition, areas 212 inside design shapes that violate minimum width rules have been enlarged.

As shown in FIG. 2, this results in the minimum width violating areas 212 being enlarged to the point in which the minimum space violating areas 210 surrounding them disappear. As for the minimum space violating areas 210, the mask shapes 202 and 206 have been restored to their original contours coinciding with the original design shapes 12 and 16 in those regions. In such case, the OPC corrections are said to have been "undone."

On the other hand, for the violating areas that lie outside of the design shapes 10, 12, 14, 16, there is a different outcome. As shown in FIG. 6, processing removes a minimum width violating area 220 from region 621. The minimum space violating area 222 is enlarged, resulting in the larger space 622.

Figure 7:
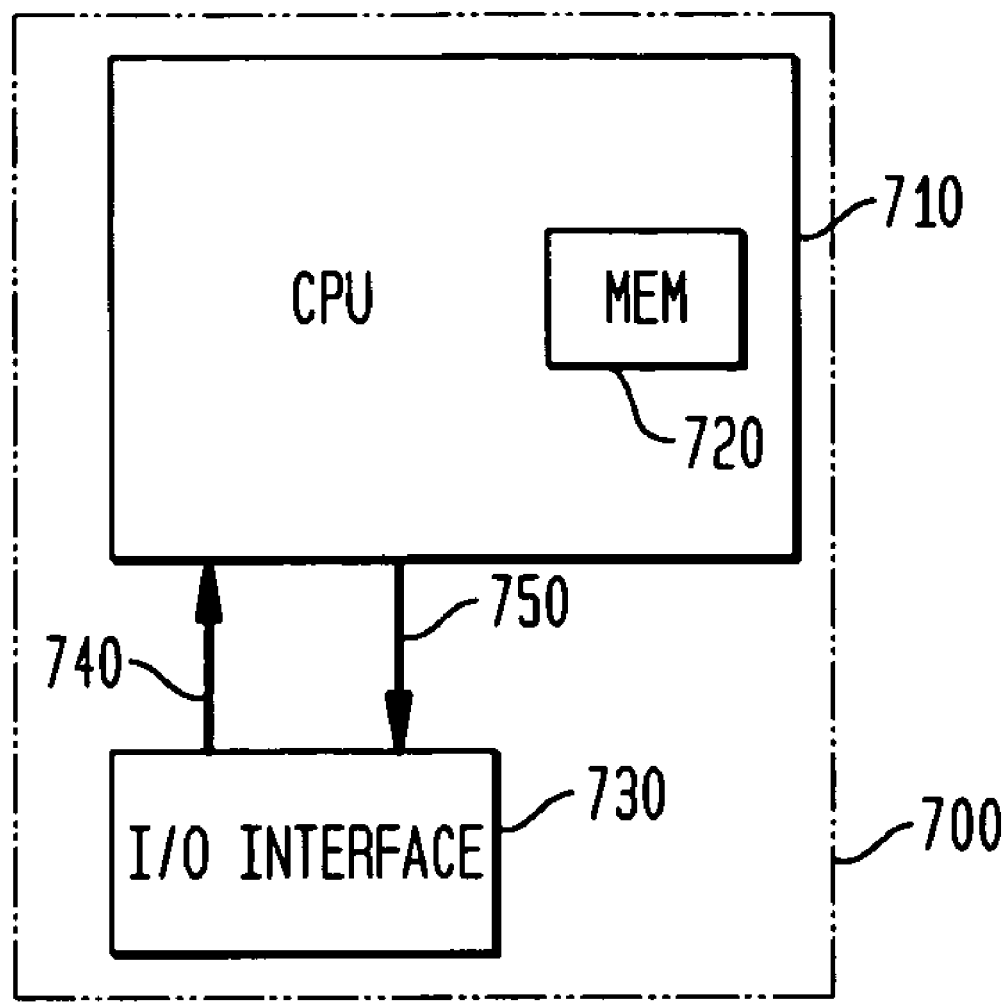
FIG. 7 illustrates a system embodiment of the invention.

FIG. 7 illustrates a system according to an embodiment of the invention. As shown in FIG. 7, the system includes a central processing unit (CPU) 710 provided with a memory 720. The CPU 710 may include a single processor or a plurality of processors arranged to execute instructions of a program in a parallel or semi-parallel manner. An input output (I/O) interface 730 is provided for inputting a program including instructions and data to the CPU 710 and for outputting the results of executing a program. The I/O interface 730 preferably includes one or more types of interfaces to removable digital storage media such as a magnetic disk, magneto-optic disk, read/write and/or read only optical disc, digital tape, removable disk drive and/or removable solid state memory such as a portable memory card. In addition to or in place thereof, the I/O interface preferably includes a network interface such as a modem or network adapter card for permitting transfer of information to and from a network. The I/O interface 730 may also include a display for outputting information to and/or inputting information from a user. The I/O interface 730 may additionally include one or more user interface devices such as a keyboard, mouse, speaker, joystick, scanner, printer, etc. and the like. To the extent that any of the above described types of removable storage media are present in the I/O interface, a program containing a set of instructions that is stored in such removable storage medium can be transferred as input 740 between the I/O interface 730 and the CPU 710. In addition to the program, a set of data to be operated upon by the instructions is also input over the I/O interface 730. Once the program and the data set to be operated upon have been loaded into the CPU 710, the CPU then executes the set of instructions of the program relative to the data and provides output 750 to the I/O interface 730 connected thereto.

In an embodiment, a program containing instructions for performing a method according to an embodiment of the invention is stored on one or more removable storage media to be provided to the I/O interface 730 and loaded into the CPU 710. Alternatively, the program containing the instructions is transferred from a storage medium such as a memory of one or more computers or other storage devices of a network to a modem, network adapter or other device of the I/O interface 730 and further transferred therefrom to the CPU 710. After the CPU 710 receives and loads the program into memory, the program is then executed relative to the set of data provided to the CPU 710. In such way, a method of correcting mask rule violations is performed by a CPU executing a program relative to a set of OPC corrected data representing the patterns of a mask.

As these and other variations and combinations of the features discussed above can be utilized, the foregoing description of the preferred embodiments should be taken by way of illustration, rather than by limitation of the invention, as defined by the claims.

The invention claimed is:

1. A method of correcting rule violations of a photomask using a digital representation of the photomask, comprising:
   providing data representing a plurality of original design shapes to be included on a photomask;
   performing corrections on said plurality of original design shapes to generate altered design shapes;
   identifying violating areas of the photomask from a digital representation of the photomask, the violating areas including at least one area that violates a minimum width rule and at least one area that violates a minimum space rule for said photomask;
   comparing said altered design shapes to said original design shapes;
   determining if at least a portion of said violating area lies inside of said original design shape and determining if at least a portion of said violating area lies outside of said original design shape; and
   manipulating a portion of a violating area that lies inside of said original design shape differently than a portion of a violating area that lies outside of said original design shape, said manipulating performed for the purpose of eliminating the rule violations.

2. The method of claim 1 further comprising manipulating each of the violating areas differently based on whether the area violates a minimum width rule and whether the area violates a minimum space rule for said photomask.

3. The method of claim 2 wherein said manipulating includes enlarging an area that violates said minimum width rule when said violating area lies inside said original design shape.

4. The method of claim 2 wherein said manipulating includes enlarging an area that violates said minimum space rule when said violating area lies outside said original design shape.

5. The method of claim 2 wherein said manipulating includes removing an area that violates said minimum width rule when said violating area lies outside said original design shape.

6. The method of claim 2 wherein said manipulating includes filling an area that violates said minimum space rule when said violating area lies inside said original design shape.

7. The method of claim 2 wherein said manipulating includes:
   enlarging an area that violates said minimum width rule when said violating area lies inside said original design shape;
   removing an area which violates said minimum width rule when said violating area lies outside said original design shape;
   filling an area which violates said minimum space rule when said violating area lies inside said original design shape; and
   enlarging an area which violates said minimum space rule when said violating area lies outside said original design shape.

8. The method of claim 1 wherein said violating areas include an area violating a minimum space rule between a filled area of a mask shape and another filled area of the mask shape.

9. The method of claim 1 wherein said violating areas include an area violating a minimun space rule between a mask shape and another mask shape of said photomask.

10. The method of claim 1 wherein said step of performing corrections comprises performing optical proximity corrections (OPC).

11. A machine readable storage medium having a set of instructions recorded thereon for performing a method of correcting rule violations of a photomask using a digital representation of the photomask, said set of instructions comprising:
   a first instruction for providing data representing a plurality of original design shapes to be included on a photomask;
   a second instruction for performing corrections on said plurality of original design shapes to generate altered design shapes;
   a third instruction for identifying violating areas of the photomask from a digital representation of the photomask, the violating areas including at least one area that violates a minimum width rule and at least one area that violates a minimum space rule for said photomask;
   a fourth instruction for comparing said altered design shapes to said original design shapes;
   a fifth instruction for determining if at least a portion of said violating area lies inside of said original design shape and for determining if at least a portion of said violating area lies outside of said original design shape; and
   a sixth instruction for manipulating a portion of violating areas that lie inside of said original design shape differently than a portion of the violating areas that lie outside of said original design shape, said manipulating performed for the purpose of eliminating the rule violations.

12. The machine readable storage medium of claim 11 further comprising an instruction for manipulating each of the violating areas differently based on whether the area violates a minimum width rule and whether the area violates a minimum space rule for said photomask.

13. The machine readable storage medium of claim 12 wherein said sixth instruction for manipulating includes an instruction for enlarging an area that violates said minimum width rule when said area lies inside a design shape.

14. The machine readable storage medium of claim 12 wherein said sixth instruction for manipulating includes an instruction for enlarging an area that violates said minimum space rule when said area lies outside a design shape.

15. The machine readable storage medium of claim 12 wherein said sixth instruction for manipulating includes removing an area that violates said minimum width rule when said area lies outside a design shape.

16. The machine readable storage medium of claim 12 wherein said sixth instruction for manipulating includes filling an area that violates said minimum space rule when said area lies inside a design shape.

17. The machine readable storage medium of claim 12 wherein said sixth instruction for manipulating includes instructions for enlarging an area that violates said minimum width rule when said area lies inside a design shape; removing an area which violates said minimum width rule when said area lies outside a design shape; filling an area which violates said minimum space rule when said area lies inside a design shape; and enlarging an area which violates said minimum space rule when said area lies outside a design shape.

18. The machine readable storage medium of claim 11 wherein said violating areas include an area violating a minimum space rule between a filled area of a mask shape and another filled area of the mask shape.

19. The machine readable storage medium of claim 11 wherein said violating areas include an area violating a minimum space rule between a mask shape and another mask shape of said photomask.

20. The machine readable storage medium of claim 11 wherein said second instructions for performing corrections comprise an instruction for performing optical proximity corrections.

21. A system operable to correct rule violations of an altered photomask using a digital representation of the original photomask having design shapes that have undergone optical proximity corrections (OPC), said system being operable to identify violating areas of the altered photomask from a digital representation of the photomask, the violating areas including at least one area that violates a minimum width rule and at least one area that violates a minimum space rule for said photomask, said system further being operable to manipulate violating areas that lie outside of original design shapes differently than violating areas that the lie inside the original design shape, said manipulation being for the purpose of eliminating the rule violations.

* * * * *